(12) United States Patent
Cho et al.

(10) Patent No.: US 11,894,255 B2
(45) Date of Patent: Feb. 6, 2024

(54) SHEATH AND TEMPERATURE CONTROL OF PROCESS KIT

(71) Applicant: APPLIED MATERIALS, INC., Santa Clara, CA (US)

(72) Inventors: Jaeyong Cho, San Jose, CA (US); Kartik Ramaswamy, San Jose, CA (US); Daniel Sang Byun, Campbell, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 85 days.

(21) Appl. No.: 16/939,160

(22) Filed: Jul. 27, 2020

(65) Prior Publication Data

US 2021/0035844 A1    Feb. 4, 2021

Related U.S. Application Data

(60) Provisional application No. 62/880,529, filed on Jul. 30, 2019.

(51) Int. Cl.
| | |
|---|---|
| *H01L 21/683* | (2006.01) |
| *H01L 21/687* | (2006.01) |
| *H01L 21/67* | (2006.01) |
| *H01J 37/32* | (2006.01) |

(52) U.S. Cl.
CPC .... *H01L 21/6833* (2013.01); *H01J 37/32642* (2013.01); *H01L 21/67103* (2013.01); *H01L 21/67109* (2013.01); *H01L 21/68721* (2013.01)

(58) Field of Classification Search
CPC ........... H01L 21/6833; H01L 21/68721; H01L 21/67103; H01L 21/67109; H01J 37/32642

USPC ..................................................... 156/345.3
See application file for complete search history.

(56) References Cited

U.S. PATENT DOCUMENTS

| | | | |
|---|---|---|---|
| 6,838,646 B2 * | 1/2005 | Inazumachi | H01L 21/67109 118/724 |
| 7,244,336 B2 | 7/2007 | Fischer et al. | |
| 7,335,278 B2 | 2/2008 | Koshimizu et al. | |
| 7,758,764 B2 | 7/2010 | Dhindsa et al. | |
| 8,555,810 B2 | 10/2013 | Park et al. | |
| 9,852,889 B1 | 12/2017 | Kellogg et al. | |
| 10,217,611 B2 | 2/2019 | Aramaki et al. | |
| 2003/0106647 A1 | 6/2003 | Koshiishi et al. | |
| 2008/0236749 A1 * | 10/2008 | Koshimizu | H01J 37/32449 156/345.33 |
| 2009/0294064 A1 * | 12/2009 | Nagayama | H01J 37/32623 156/345.39 |

(Continued)

FOREIGN PATENT DOCUMENTS

| | | |
|---|---|---|
| JP | 2014-072355 A | 4/2014 |
| WO | WO 2010/011521 A2 | 1/2010 |

OTHER PUBLICATIONS

International Search Report for PCT/US2020/043910, dated Nov. 9, 2020.

*Primary Examiner* — Charlee J. C. Bennett
(74) *Attorney, Agent, or Firm* — MOSER TABOADA

(57) ABSTRACT

Embodiments of a process kit are provided herein. In some embodiments, a process kit for use in a substrate processing chamber includes: a ceramic ring having an upper surface and a lower surface, wherein the ceramic ring includes a chucking electrode disposed in the ceramic ring and a heating element disposed in the ceramic ring; and an edge ring disposed on the ceramic ring.

20 Claims, 2 Drawing Sheets

(56) References Cited

U.S. PATENT DOCUMENTS

| | | | |
|---|---|---|---|
| 2010/0018648 A1* | 1/2010 | Collins | H01L 21/6833 156/345.24 |
| 2010/0040768 A1* | 2/2010 | Dhindsa | H01J 37/32724 427/248.1 |
| 2010/0243606 A1* | 9/2010 | Koshimizu | H01J 37/32174 156/345.44 |
| 2012/0160808 A1* | 6/2012 | Kikuchi | H01L 21/6831 156/345.52 |
| 2015/0294886 A1* | 10/2015 | Ravi | H01L 21/67109 165/80.3 |
| 2015/0373783 A1* | 12/2015 | Kitagawa | H01L 21/67103 156/345.52 |
| 2016/0035610 A1 | 2/2016 | Park et al. | |
| 2016/0111315 A1* | 4/2016 | Parkhe | H01L 21/6831 361/234 |
| 2016/0189994 A1* | 6/2016 | Sasaki | H02N 13/00 361/234 |
| 2017/0053820 A1 | 2/2017 | Bosch et al. | |
| 2017/0200588 A1* | 7/2017 | Joubert | H01J 37/32715 |
| 2017/0330734 A1 | 11/2017 | Lee et al. | |
| 2018/0082822 A1 | 3/2018 | Kellogg et al. | |
| 2018/0182647 A1 | 6/2018 | Noh et al. | |
| 2018/0204757 A1* | 7/2018 | Fushimi | H01J 37/32165 |
| 2018/0315583 A1 | 11/2018 | Luere et al. | |
| 2018/0315640 A1* | 11/2018 | Ueda | H01L 21/68742 |
| 2019/0013184 A1 | 1/2019 | Cui et al. | |
| 2019/0051501 A1* | 2/2019 | Koizumi | H01L 21/68735 |
| 2020/0251313 A1* | 8/2020 | Rogers | H01L 21/67069 |
| 2021/0296098 A1* | 9/2021 | Cho | H01L 21/68735 |

\* cited by examiner

SHEATH AND TEMPERATURE CONTROL OF PROCESS KIT

CROSS-REFERENCE TO RELATED APPLICATIONS

This application claims benefit of U.S. provisional patent application Ser. No. 62/880,529 filed Jul. 30, 2019 which is herein incorporated by reference, in its entirety.

FIELD

Embodiments of the present disclosure generally relate to substrate processing systems, and more specifically, to process kits for use in substrate processing systems.

BACKGROUND

Radio frequency (RF) power is often used in etching processes, for example, requiring very high aspect ratio holes to make contacts or deep trenches for laying infrastructure for electrical pathways. RF power can be used for plasma generation and/or for creating bias voltage on a substrate being processed to attract ions from bulk plasma. An electrostatic chuck is used to electrostatically hold a substrate to control substrate temperature during processing. The electrostatic chuck typically includes an electrode embedded in a dielectric plate and a cooling plate disposed below the dielectric plate. A process kit can include an edge ring that is often disposed above the cooling plate and about the dielectric plate to guide a substrate.

However, when a substrate is placed in a processing chamber after long idle time, a temperature of the edge ring goes up as substrates are processed with two different RF powers. A temperature differential between the edge ring and the dielectric plate may cause a non-uniform chemical reaction between the edge ring and process gases as compared to the dielectric plate and process gases, causing process drift.

An RF power source for creating bias is applied to the cooling plate. The inventors have observed that as a height of the edge ring comes down due to ion bombardment during substrate processing, equipotential lines in a sheath created by the bias RF power source become tilted proximate the edge ring, causing process drift.

Accordingly, the inventors have provided embodiments of improved process kits.

SUMMARY

Embodiments of process kits for use in substrate processing chamber are provided herein. In some embodiments, a process kit for use in a substrate processing chamber includes: a ceramic ring having an upper surface and a lower surface, wherein the ceramic ring includes a chucking electrode disposed in the ceramic ring and a heating element disposed in the ceramic ring; and an edge ring disposed on the ceramic ring.

In some embodiments, a substrate support for use in a substrate processing chamber includes a ceramic plate having a first side configured to support a substrate and a second side opposite the first side, wherein the ceramic plate includes an electrode embedded in the ceramic plate; a first cooling plate coupled to the second side of the ceramic plate; a ceramic ring disposed about the ceramic plate and having a first side and a second side opposite the first side, wherein the ceramic ring includes one or more chucking electrodes and a heating element disposed in the ceramic ring, and wherein the ceramic ring is spaced apart from the first cooling plate; an edge ring disposed on the ceramic ring; and a second cooling plate coupled to the second side of the ceramic ring, wherein the second cooling plate is thermally isolated from the first cooling plate.

In some embodiments, a process chamber includes a chamber body having a substrate support disposed within an inner volume of the chamber body, wherein the substrate support includes: a cooling plate; a ceramic plate disposed above the cooling plate and a gas channel extending from a bottom surface to a top surface of the ceramic plate; a ceramic ring disposed above the cooling plate and about the ceramic plate with a gap therebetween and having one or more chucking electrodes and a heating element disposed in the ceramic ring; an edge ring disposed on the ceramic ring; and a power source coupled to the heating element to control a temperature of the ceramic ring independent of the temperature of the ceramic plate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
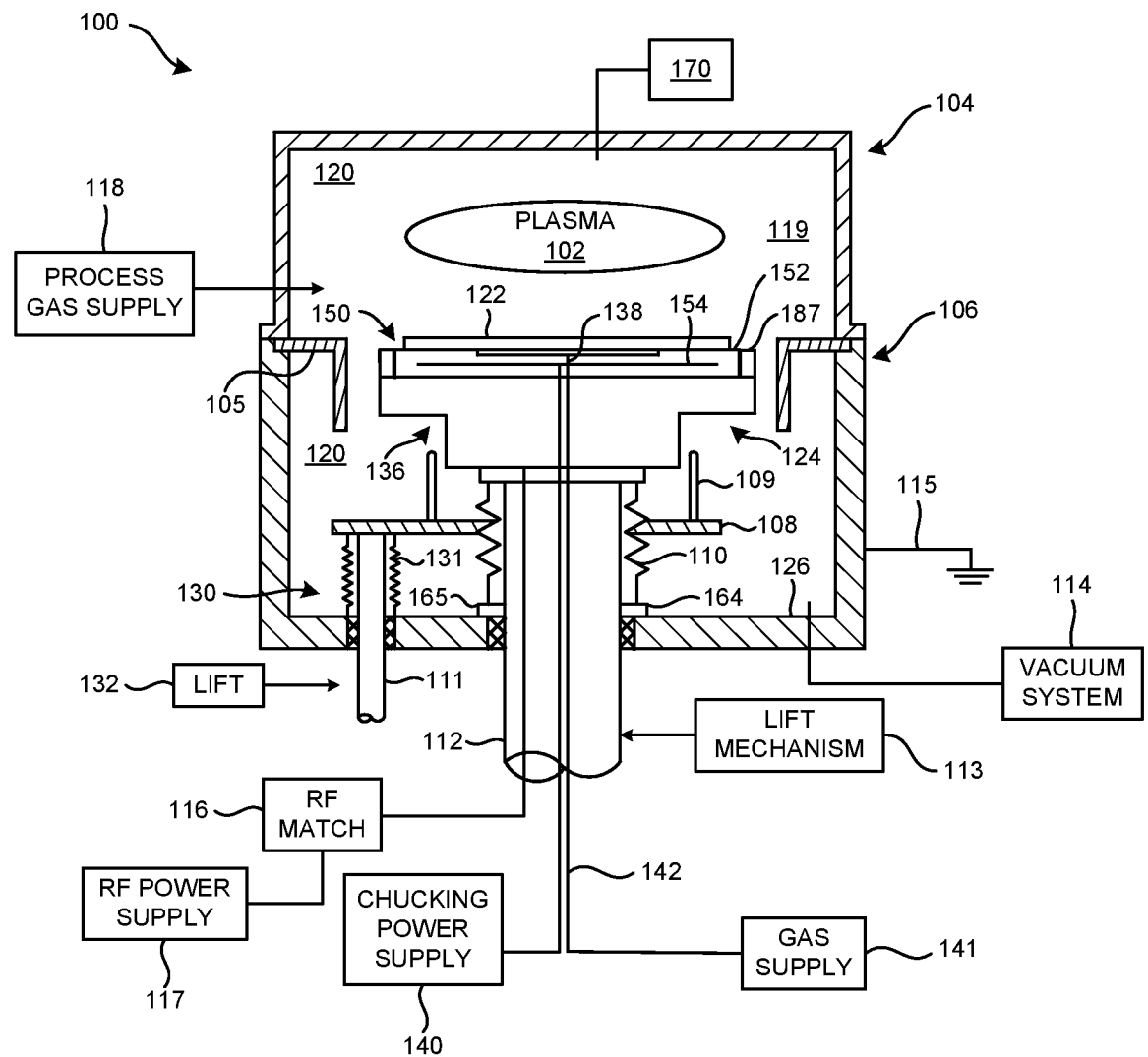
FIG. 1 depicts a schematic side view of a process chamber having a substrate support in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of substrate supports and process kits for use in a substrate processing chamber are provided herein. The substrate support includes a ceramic plate having a support surface to support a substrate. The substrate support includes a process kit having a ceramic ring disposed about the ceramic plate. The process kit further includes an edge ring disposed on the ceramic ring to guide the substrate. The ceramic ring and the ceramic plate are advantageously thermally isolated from each other to provide independent temperature control.

FIG. 1 depicts a schematic side view of a process chamber (e.g., a plasma processing chamber) having a substrate support in accordance with at least some embodiments of the present disclosure. In some embodiments, the plasma processing chamber is an etch processing chamber. However, other types of processing chambers configured for different processes can also use or be modified for use with embodiments of the electrostatic chuck described herein.

The chamber 100 is a vacuum chamber which is suitably adapted to maintain sub-atmospheric pressures within a chamber interior volume 120 during substrate processing. The chamber 100 includes a chamber body 106 covered by a lid 104 which encloses a processing volume 119 located in the upper half of chamber interior volume 120. The chamber 100 may also include one or more shields 105 circumscribing various chamber components to prevent unwanted reaction between such components and ionized process material. The chamber body 106 and lid 104 may be made of metal, such as aluminum. The chamber body 106 may be grounded via a coupling to ground 115.

A substrate support 124 is disposed within the chamber interior volume 120 to support and retain a substrate 122, such as a semiconductor wafer, for example, or other such substrate as may be electrostatically retained. The substrate support 124 may generally comprise an electrostatic chuck 150 (described in more detail below with respect to FIGS. 2-3) and a hollow support shaft 112 for supporting the electrostatic chuck 150. The electrostatic chuck 150 comprises a ceramic plate 152 having one or more electrodes 154 disposed therein and a cooling plate 136. The hollow support shaft 112 provides a conduit to provide, for example, backside gases, process gases, fluids, coolants, power, or the like, to the electrostatic chuck 150. The substrate support 124 includes a ceramic ring 187 (described in more detail below with respect to FIGS. 2-3) disposed about the ceramic plate 152.

In some embodiments, the hollow support shaft 112 is coupled to a lift mechanism 113, such as an actuator or motor, which provides vertical movement of the electrostatic chuck 150 between an upper, processing position (as shown in FIG. 1) and a lower, transfer position (not shown). A bellows assembly 110 is disposed about the hollow support shaft 112 and is coupled between the electrostatic chuck 150 and a bottom surface 126 of chamber 100 to provide a flexible seal that allows vertical motion of the electrostatic chuck 150 while preventing loss of vacuum from within the chamber 100. The bellows assembly 110 also includes a lower bellows flange 164 in contact with an o-ring 165 or other suitable sealing element which contacts the bottom surface 126 to help prevent loss of chamber vacuum.

The hollow support shaft 112 provides a conduit for coupling a backside gas supply 141, a chucking power supply 140, and RF sources (e.g., RF plasma power supply 170 and a bias power supply 117) to the electrostatic chuck 150. In some embodiments, RF energy supplied by the RF plasma power supply 170 may have a frequency of about 40 MHz or greater. The backside gas supply 141 is disposed outside of the chamber body 106 and supplies heat transfer gas to the electrostatic chuck 150. In some embodiments, a RF plasma power supply 170 and a bias power supply 117 are coupled to the electrostatic chuck 150 via respective RF match networks (only RF match network 116 shown). In some embodiments, the substrate support 124 may alternatively include AC, DC, or RF bias power.

A substrate lift 130 can include lift pins 109 mounted on a platform 108 connected to a shaft 111 which is coupled to a second lift mechanism 132 for raising and lowering the substrate lift 130 so that the substrate 122 may be placed on or removed from the electrostatic chuck 150. The electrostatic chuck 150 may include thru-holes to receive the lift pins 109. A bellows assembly 131 is coupled between the substrate lift 130 and bottom surface 126 to provide a flexible seal which maintains the chamber vacuum during vertical motion of the substrate lift 130.

In some embodiments, the electrostatic chuck 150 includes gas distribution channels 138 extending from a lower surface of the electrostatic chuck 150 (e.g., bottom surface of the cooling plate 136) to various openings in an upper surface of the electrostatic chuck 150. The gas distribution channels 138 are configured to provide backside gas, such as nitrogen (N) or helium (He), to the top surface of the electrostatic chuck 150 to act as a heat transfer medium. The gas distribution channels 138 are in fluid communication with the backside gas supply 141 via gas conduit 142 to control the temperature and/or temperature profile of the electrostatic chuck 150 during use.

The chamber 100 is coupled to and in fluid communication with a vacuum system 114 which includes a throttle valve (not shown) and vacuum pump (not shown) which are used to exhaust the chamber 100. The pressure inside the chamber 100 may be regulated by adjusting the throttle valve and/or vacuum pump. The chamber 100 is also coupled to and in fluid communication with a process gas supply 118 which may supply one or more process gases to the chamber 100 for processing a substrate disposed therein.

In operation, for example, a plasma 102 may be created in the chamber interior volume 120 to perform one or more processes. The plasma 102 may be created by coupling power from a plasma power source (e.g., RF plasma power supply 170) to a process gas via one or more electrodes near or within the chamber interior volume 120 to ignite the process gas and creating the plasma 102. A bias power may also be provided from a bias power supply (e.g., bias power supply 117) to the one or more electrodes 154 within the electrostatic chuck 150 to attract ions from the plasma towards the substrate 122.

Figure 2:
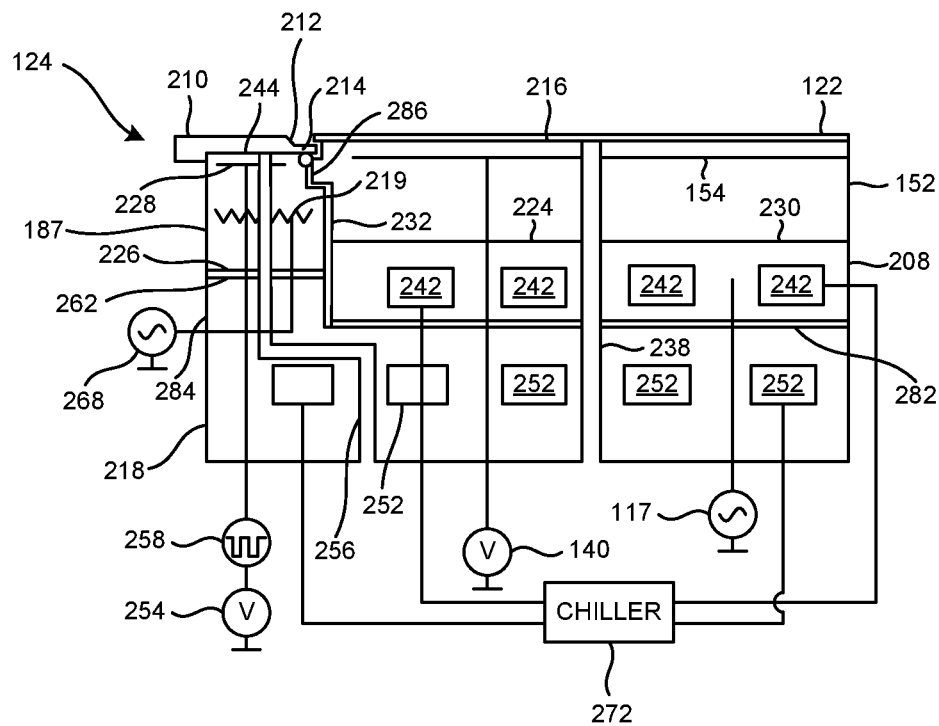
FIG. 2 depicts a schematic partial side view of a substrate support in accordance with at least some embodiments of the present disclosure.

FIG. 2 depicts a schematic partial side view of a substrate support in accordance with at least some embodiments of the present disclosure. The ceramic plate 152 includes a first side 216 configured to support a substrate 122 and a second side 224 opposite the first side 216. The ceramic plate 152 includes one or more electrodes 154 embedded therein. In some embodiments, the one or more electrodes 154 comprise an upper electrode, a lower electrode, and a plurality of posts electrically coupled to the upper and lower electrodes. In some embodiments, the ceramic plate 152 is made of aluminum nitride (AlN) or aluminum oxide ($Al_2O_3$). In some embodiments, the ceramic plate 152 includes an annular ring 286 extending radially outward from an outer sidewall 232 of the ceramic plate 152.

In some embodiments, the cooling plate 136 is made of an electrically conductive material, for example, aluminum (Al). In some embodiments, the cooling plate 136 includes a first cooling plate 208 coupled to the second side 224 of the ceramic plate 152. In some embodiments, an outer surface of the first cooling plate 208 is coplanar with an outer surface of the ceramic plate 152. The first cooling plate 208 includes a plurality of first coolant channels 242. The first coolant channels 242 are configured to flow a coolant therethrough to cool the ceramic plate 152.

In some embodiments, a bonding layer 230 is disposed between the ceramic plate 152 and the first cooling plate 208. The bonding layer 230 is configured to provide improved thermal coupling between the first cooling plate 208 and the ceramic plate 152. In some embodiments, the bonding layer 230 comprises silicone. In some embodiments, the bonding layer 230 has a thickness of about 0.1 mm to about 0.4 mm. In some embodiments, the bonding layer 230 has a thermal conductivity of about 0.2 W/mK to about 1.2 W/mk.

A ceramic ring 187 is disposed about the ceramic plate 152. The ceramic ring 187 includes a first side 244 and a second side 226 opposite the first side 244. In some embodiments, the first side 244 is an upper side. In some embodiments, the ceramic ring 187 includes one or more chucking electrodes 228 embedded therein. An edge ring 210 is disposed on the ceramic ring 187. In some embodiments, an outer diameter of the edge ring 210 is greater than an outer diameter of the ceramic ring 187. The edge ring 210 includes an angled inner surface 212 disposed between an uppermost surface of the edge ring 210 and a second upper surface 214. The one or more chucking electrodes 228 are coupled to a chucking power supply 254 to hold the edge ring 210. In some embodiments, the ceramic ring 187 is made of aluminum nitride (AlN) or aluminum oxide ($Al_2O_3$).

In some embodiments, the bias power supply 117 is electrically coupled to the cooling plate 136 to create a same bias voltage on the substrate 122 and the edge ring 210. In operation, the bias power supply 117 applied on the cooling plate 136 creates a sheath in between the substrate 122 and the plasma 102. As a result, ions from the plasma 102 are attracted to the substrate 122 that is biased, and the ions accelerate through the sheath perpendicular to equipotential lines within the sheath. When the edge ring 210 erodes over time due to processing, a shape of the sheath bends proximate an edge of the substrate 122 leading to non-uniform processing of the substrate 122.

For a minimum impact on the substrate 122 and direct voltage control, the bias power supply 117 is advantageously configured to provide a negative pulsed DC power source 258 to the one or more chucking electrodes 228. The negative pulsed DC power source 258 is configured to provide a power profile to correct sheath bending and maintain a substantially flat sheath profile across the substrate 122. In some embodiments, the one or more chucking electrodes 228 are disposed less than 0.3 mm from a bottom of the edge ring 210 to provide efficient coupling of the negative pulsed DC power to the edge ring 210.

The ceramic ring 187 includes a heating element 219 embedded in the ceramic ring 187. The heating element 219 is coupled to a power source 268 (e.g., an AC power source) to heat the heating element 219. In some embodiments, a temperature probe is disposed on the second side 226 of the ceramic ring 187 to monitor and control a temperature of the ceramic ring 187 by controlling the power applied to the heating element 219 by the power source 268. In some embodiments, the chucking electrode is disposed between the first side 244 and the heating element 219. The ceramic ring 187 is spaced apart from the ceramic plate 152. In some embodiments, the ceramic ring 187 is spaced apart from the first cooling plate 208.

In some embodiments, the gas distribution channels 138 include a second gas channel (See FIG. 2) that extends from a lower surface of the electrostatic chuck 150 (e.g., bottom surface of the cooling plate 136) to a top surface of the ceramic ring 187. The second gas channel is configured to provide backside gas, such as nitrogen (N) or helium (He), to the top surface of the ceramic ring 187 to act as a heat transfer medium.

In some embodiments, the ceramic ring 187 includes a first notch at an upper interior edge. In some embodiments, the annular ring 286 is disposed in the first notch. In some embodiments, the ceramic ring 187 includes a second notch at an upper interior edge. In some embodiments, the second notch is configured to accommodate an o-ring to provide a seal for the backside gas.

A second cooling plate 218 is coupled to the second side 226 of the ceramic ring 187. In some embodiments, the second cooling plate 218 is electrically connected but thermally isolated from the first cooling plate 208. The second cooling plate 218 a plurality of second coolant channels 252. The second coolant channels 252 are configured to flow a coolant therethrough to cool the ceramic ring 187. In some embodiments, the second coolant channels 252 are fluidly independent from the first coolant channels 242 to advantageously to cool the edge ring 210 and substrate 122 independently. The first coolant channels 242 and the second coolant channels 252 are coupled to a chiller 272 configured to recirculate a coolant therethrough. In some embodiments, a bonding layer 262 is disposed between the ceramic ring 187 and the second cooling plate 218. In some embodiments, the bonding layer 262 is similar to bonding layer 230.

In some embodiments, as shown in FIG. 2, the first cooling plate 208 has a disk shape and is disposed on the second cooling plate 218 having a disk shape. In some embodiments, the second cooling plate 218 has a raised lip 284 at a peripheral edge of the second cooling plate 218. In some embodiments, a width of the raised lip 284 is substantially the same as a width of the ceramic ring 187. The raised lip 284 is spaced from the first cooling plate 208 to provide thermal isolation from the first cooling plate 208.

In some embodiments, as shown in FIG. 2, a thermal isolation layer 282 is disposed between the first cooling plate 208 and the second cooling plate 218 to thermally isolate the first cooling plate 208 from the second cooling plate 218. In some embodiments, the thermal isolation layer 282 is made of CIRLEX®, manufactured by DuPont Electronics, Inc. in Midland, MI. In some embodiments, the thermal isolation layer 282 has a thickness is about 1.0 mm to about 2.0 mm. In some embodiments, the thermal isolation layer 282 has a thermal conductivity of about 0.1 W/mK to about 0.3 W/mK.

In some embodiments, as shown in FIG. 2, the gas distribution channels 138 include a first gas channel 238 that extends from a bottom of the second cooling plate 218 to the first side 216, or top surface, of the ceramic plate 152 via the second cooling plate 218, the first cooling plate 208, and the ceramic plate 152. In some embodiments, the gas distribution channels 138 include a second gas channel 256 that extends from the bottom of the second cooling plate 218 to the first side 244 of the ceramic ring 187 through the second cooling plate 218 and the ceramic ring 187. The first gas channel 238 and the second gas channel 256 are configured to provide backside gas to the first side 216 of the ceramic plate 152 and the first side 244 of the ceramic ring 187, respectively. In some embodiments, the first gas channel 238 and the second gas channel 256 are fluidly independent within the substrate support 124 to provide independent temperature control to the substrate 122 and the edge ring 210.

Figure 3:
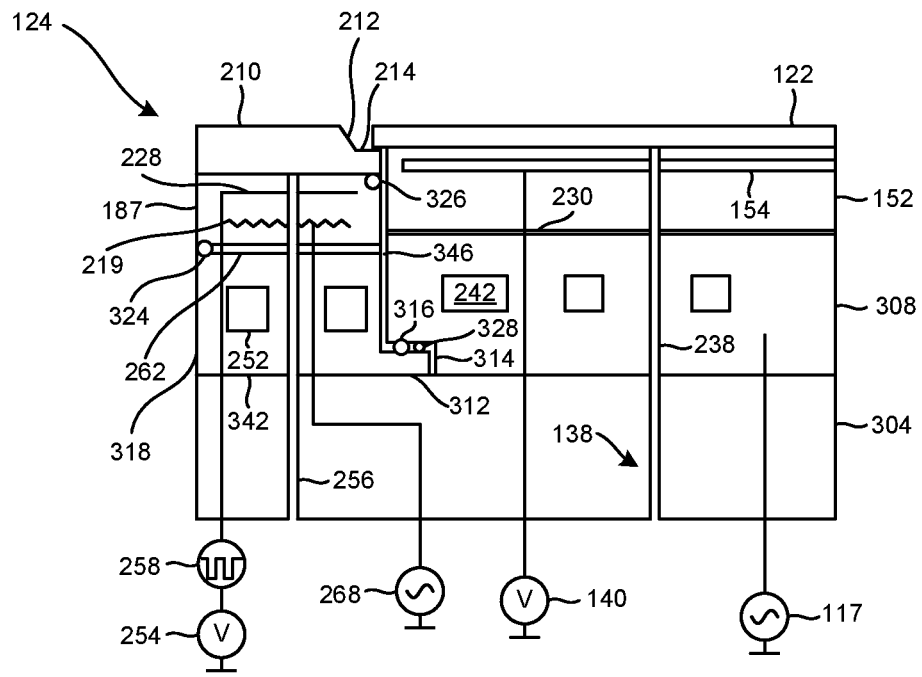
FIG. 3 depicts a schematic partial side view of a substrate support in accordance with at least some embodiments of the present disclosure.

FIG. 3 depicts a schematic partial side view of a substrate support in accordance with at least some embodiments of the present disclosure. In some embodiments, as shown in FIG. 3, a second cooling plate 318 is ring shaped and is disposed about a first cooling plate 308. In some embodiments, the first cooling plate 308 includes a notch 314 at a lower peripheral edge. In some embodiments, the second cooling plate 318 includes an annular tab 312 that extends radially inward from a lower surface 342 of the second cooling plate 318. The annular tab 312 extends into the notch 314 without contacting the first cooling plate 308. In some embodiments, a gap 346 extends between the first cooling plate 308 and the second cooling plate 318 to thermally isolate the first cooling plate 308 from the second cooling plate 318. In some embodiments, the lower surface 342 of the second cooling plate 318 is coplanar with a lower surface of the first cooling plate 308. In some embodiments, the first cooling plate 208 and the second cooling plate 318 are disposed on and coupled to an insulator 304. In some embodiments, the insulator is made of a plastic material.

In some embodiments, an o-ring 316 is disposed between a surface defined by the notch 314 and the annular tab 312 to provide a seal to reduce or prevent backside gas leakage into the gap 346. In some embodiments, an annular gasket 328 is disposed between a surface defined by the notch 314 and the annular tab 312 to electrically couple the first cooling plate 308 and the second cooling plate 318. In some embodiments, a second o-ring 326 is disposed between the ceramic ring 187 and the edge ring 210 to provide a seal to reduce or prevent backside gas leakage into the gap 346. In some embodiments, a third o-ring 324 is disposed between the ceramic ring 187 and the second cooling plate 218 to provide a seal to reduce or prevent backside gas leakage therebetween.

While the foregoing is directed to embodiments of the present disclosure, other and further embodiments of the disclosure may be devised without departing from the basic scope thereof.

The invention claimed is:

1. A process kit for use in a substrate processing chamber, comprising:
   a ceramic plate having a first side configured to support a substrate and a second side opposite the first side, wherein the ceramic plate includes an electrode embedded in the ceramic plate;
   a first cooling plate coupled to the second side of the ceramic plate;
   a ceramic ring disposed about the ceramic plate and having a first side and a second side opposite the first side, wherein the ceramic ring includes one or more chucking electrodes and a heating element disposed in the ceramic ring, wherein the ceramic ring is spaced apart from the ceramic plate and the first cooling plate;
   an edge ring disposed on the ceramic ring;
   a second cooling plate coupled to the second side of the ceramic ring, wherein the second cooling plate is a ring disposed about the first cooling plate with a gap disposed between the first cooling plate and the second cooling plate;
   wherein the second cooling plate is thermally isolated from the first cooling plate;
   wherein the first cooling plate and the second cooling plate include coolant channels configured to circulate a coolant, wherein the coolant channels of the first cooling plate are fluidly independent from the coolant channels of the second cooling plate;
   a first gas channel extending from the first side to the second side of the ceramic plate;
   a second gas channel extending from the first side to the second side of the ceramic ring; and
   one or more sealing elements disposed between:
      the ceramic ring and the second cooling plate;
      the first cooling plate and the second cooling plate; and
      the ceramic ring and the edge ring, dimensioned and arranged to prevent a gas flow from the second gas channel into the gap disposed between the first cooling plate and the second cooling plate.

2. The process kit of claim 1, wherein the first side of the ceramic ring forms an upper surface, and wherein the one or more chucking electrodes are disposed between the upper surface and the heating element.

3. The process kit of claim 1, wherein the ceramic ring comprises aluminum nitride (AlN) or aluminum oxide ($Al_2O_3$).

4. The process kit of claim 1, wherein the ceramic ring includes a notch at an upper interior edge.

5. The process kit of claim 1, further comprising a bonding layer disposed between the ceramic ring and the second cooling plate.

6. A substrate support for use in a substrate processing chamber, comprising:
   a ceramic plate having a first side configured to support a substrate and a second side opposite the first side, wherein the ceramic plate includes an electrode embedded in the ceramic plate;
   a first cooling plate coupled to the second side of the ceramic plate;
   a ceramic ring disposed about the ceramic plate and having a first side and a second side opposite the first side, wherein the ceramic ring includes one or more chucking electrodes and a heating element disposed in the ceramic ring, wherein the ceramic ring is spaced apart from the ceramic plate and the first cooling plate;
   an edge ring disposed on the ceramic ring;
   a second cooling plate coupled to the second side of the ceramic ring, wherein the second cooling plate is a ring disposed about the first cooling plate with a gap disposed between the first cooling plate and the second cooling plate;
   wherein the second cooling plate is thermally isolated from the first cooling plate;
   wherein the first cooling plate and the second cooling plate include coolant channels configured to circulate a coolant, wherein the coolant channels of the first cooling plate are fluidly independent from the coolant channels of the second cooling plate;
   a first gas channel extending from the first side to the second side of the ceramic plate;
   a second gas channel extending from the first side to the second side of the ceramic ring; and
   one or more sealing elements disposed between:
      the ceramic ring and the second cooling plate;
      the first cooling plate and the second cooling plate; and
      the ceramic ring and the edge ring, dimensioned and arranged to prevent a gas flow from the second gas channel into the gap disposed between the first cooling plate and the second cooling plate.

7. The substrate support of claim 6, wherein the one or more chucking electrodes are coupled to a negative pulsed DC power source.

8. The substrate support of claim 6, wherein the edge ring includes an angled inner surface.

9. The substrate support of claim 6, wherein the first cooling plate is disposed on the second cooling plate with a thermal isolation layer therebetween.

10. A process chamber, comprising:
   a chamber body having a substrate support disposed within an inner volume of the chamber body, wherein the substrate support includes:
      a ceramic plate having a first side configured to support a substrate and a second side opposite the first side, wherein the ceramic plate includes an electrode embedded in the ceramic plate;

a first cooling plate coupled to the second side of the ceramic plate;
a ceramic ring disposed about the ceramic plate and having a first side and a second side opposite the first side, wherein the ceramic ring includes one or more chucking electrodes and a heating element disposed in the ceramic ring,
wherein the ceramic ring is spaced apart from the ceramic plate and the first cooling plate;
an edge ring disposed on the ceramic ring;
a second cooling plate coupled to the second side of the ceramic ring, wherein the second cooling plate is a ring disposed about the first cooling plate with a gap disposed between the first cooling plate and the second cooling plate;
wherein the second cooling plate is thermally isolated from the first cooling plate;
wherein the first cooling plate and the second cooling plate include coolant channels configured to circulate a coolant, wherein the coolant channels of the first cooling plate are fluidly independent from the coolant channels of the second cooling plate;
a first gas channel extending from the first side to the second side of the ceramic plate;
a second gas channel extending from the first side to the second side of the ceramic ring; and
one or more sealing elements disposed between:
the ceramic ring and the second cooling plate;
the first cooling plate and the second cooling plate; and
the ceramic ring and the edge ring, dimensioned and arranged to prevent a gas flow from the second gas channel into the gap disposed between the first cooling plate and the second cooling plate; and
a power source coupled to the heating element to control a temperature of the ceramic ring independent of the temperature of the ceramic plate.

11. The process chamber of claim 10, wherein the first cooling plate and the second cooling plate are disposed on an insulator.

12. The process chamber of claim 10, wherein the first cooling plate is disposed on the second cooling plate with a thermal isolation layer therebetween.

13. The substrate support of claim 6, wherein the one or more sealing elements comprise at least one of:
an o-ring disposed between the ceramic ring and the second cooling plate;
an o-ring disposed between the first cooling plate and the second cooling plate; and
an o-ring disposed between the ceramic ring and the edge ring.

14. The substrate support of claim 13, wherein the second cooling plate includes an annular tab that extends radially inward from a lower surface of the second cooling plate into a corresponding notch disposed into a lower side of the first cooling plate without contact between the first and second cooling plates, and wherein the o-ring is disposed between the annular tab and the notch.

15. The substrate support of claim 13, wherein the o-ring disposed between the ceramic ring and the edge ring is dimensioned and arranged to seal between the ceramic ring, the edge ring, and the ceramic plate.

16. The substrate support of claim 6, wherein the first side of the ceramic ring forms an upper surface, and wherein one or more chucking electrodes are disposed between the upper surface and the heating element.

17. The substrate support of claim 6, wherein the ceramic ring comprises aluminum nitride (AlN) or aluminum oxide ($Al_2O_3$).

18. The substrate support of claim 6, wherein the ceramic ring includes a notch at an upper interior edge.

19. The substrate support of claim 6, further comprising a bonding layer disposed between the ceramic ring and the second cooling plate.

20. The substrate support of claim 19, wherein the one or more sealing elements disposed between the ceramic ring and the edge ring comprise an o-ring disposed between the ceramic ring and the second cooling plate proximate to the bonding layer.

* * * * *